US008725483B2

(12) United States Patent
Ei-Essawy et al.

(10) Patent No.: US 8,725,483 B2
(45) Date of Patent: May 13, 2014

(54) MINIMIZING THE MAXIMUM REQUIRED LINK CAPACITY FOR THREE-DIMENSIONAL INTERCONNECT ROUTING

(75) Inventors: Wael R. Ei-Essawy, Austin, TX (US); David A. Papa, Austin, TX (US); Jarrod A. Roy, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 646 days.

(21) Appl. No.: 13/008,935

(22) Filed: Jan. 19, 2011

(65) Prior Publication Data

US 2012/0185216 A1 Jul. 19, 2012

(51) Int. Cl.
*G06G 7/48* (2006.01)
*G06F 17/50* (2006.01)

(52) U.S. Cl.
CPC ........ *G06F 17/5077* (2013.01); *G06F 17/5081* (2013.01)
USPC ............... 703/13; 703/16; 716/118; 716/119; 716/126

(58) Field of Classification Search
None
See application file for complete search history.

(56) References Cited

U.S. PATENT DOCUMENTS

| 4,873,459 | A | 10/1989 | El Gamal et al. |
| 5,014,419 | A | 5/1991 | Cray et al. |
| 5,129,830 | A | 7/1992 | Krajewski et al. |
| 5,152,696 | A | 10/1992 | Krajewski et al. |
| 5,726,902 | A | 3/1998 | Mahmood et al. |
| 5,787,459 | A | 7/1998 | Stallmo et al. |
| 5,825,661 | A | 10/1998 | Drumm |
| 5,896,299 | A | 4/1999 | Ginetti et al. |
| 6,080,201 | A | 6/2000 | Hojat et al. |
| 6,086,627 | A | * | 7/2000 | Bass et al. ...................... 716/112 |

(Continued)

FOREIGN PATENT DOCUMENTS

| JP | 11145297 A | 5/1999 |
| JP | 2000322458 A | 11/2000 |
| JP | 2001134625 A | 5/2001 |
| JP | 2004356780 | 12/2004 |

OTHER PUBLICATIONS

J. Kim, C. Nicopoulos, D. Park, R. Das, Y. Xie, N. Vijaykrishnan, M. Yousif, C. Das, "A Novel Dimensionally Decomposed Router for on Chip Communication in 3D Architectures" pp. 1-12, Jun. 2007.*

(Continued)

*Primary Examiner* — Omar Fernandez Rivas
*Assistant Examiner* — Kibrom Gebresilassie
(74) *Attorney, Agent, or Firm* — Francis Lammes; Stephen J. Walder, Jr.; Libby Z. Toub

(57) ABSTRACT

A mechanism is provided for determining connectivity while minimizing wiring in an electronic system. The mechanism identifies a configuration of the electronic system, a location of each module in a plurality of modules within the electronic system and at least one constraint with regard to wiring the electronic system, the location of each module being identified using three-dimensional coordinates. The mechanism routes a separate cable from each module in the plurality of modules to each of the other modules in the plurality of modules without violating any constraints, thereby forming a plurality of cables. The mechanism then generates a cabling list indicating how each cable in the plurality of cables is to be routed in the electronic system in order to not violate any constraints and provide connectivity while minimizing wiring.

19 Claims, 6 Drawing Sheets

(56) References Cited

U.S. PATENT DOCUMENTS

| | | | |
|---|---|---|---|
| 6,189,131 B1 | 2/2001 | Graef et al. | |
| 6,230,304 B1* | 5/2001 | Groeneveld et al. | 716/113 |
| 6,442,745 B1* | 8/2002 | Arunachalam et al. | 716/129 |
| 6,536,024 B1 | 3/2003 | Hathaway | |
| 6,725,438 B2 | 4/2004 | van Ginneken | |
| 6,973,473 B1 | 12/2005 | Novaes et al. | |
| 7,039,891 B2 | 5/2006 | Tetelbaum | |
| 7,043,562 B2 | 5/2006 | Dally et al. | |
| 7,222,311 B2 | 5/2007 | Kaufman et al. | |
| 7,284,222 B1 | 10/2007 | Rohe et al. | |
| 7,342,414 B2 | 3/2008 | DeHon et al. | |
| 7,367,005 B2* | 4/2008 | Kosugi et al. | 716/114 |
| 7,379,424 B1 | 5/2008 | Krueger | |
| 7,395,524 B2 | 7/2008 | Roesner et al. | |
| 7,426,186 B2* | 9/2008 | Acharya et al. | 370/238 |
| 7,555,566 B2 | 6/2009 | Blumrich et al. | |
| 7,613,900 B2 | 11/2009 | Gonzalez et al. | |
| 7,679,401 B1 | 3/2010 | Redgrave | |
| 7,694,242 B1 | 4/2010 | Li et al. | |
| 7,761,687 B2 | 7/2010 | Blumrich et al. | |
| 7,979,732 B2 | 7/2011 | Curley et al. | |
| 8,074,190 B1 | 12/2011 | Li et al. | |
| 8,370,782 B2* | 2/2013 | Alpert et al. | 716/114 |
| 8,407,660 B2* | 3/2013 | Solomon | 716/138 |
| 8,423,940 B2* | 4/2013 | Daellenbach et al. | 716/115 |
| 2004/0128341 A1 | 7/2004 | Synek et al. | |
| 2006/0149506 A1 | 7/2006 | Cutuli et al. | |
| 2008/0022079 A1 | 1/2008 | Archer et al. | |
| 2008/0148203 A1 | 6/2008 | Alpert et al. | |
| 2008/0295073 A1 | 11/2008 | Roesner et al. | |
| 2009/0064073 A1 | 3/2009 | Alpert et al. | |
| 2009/0070549 A1* | 3/2009 | Solomon | 712/10 |
| 2009/0193376 A1 | 7/2009 | Alpert et al. | |
| 2009/0193377 A1 | 7/2009 | Puri et al. | |
| 2009/0292383 A1 | 11/2009 | Bohl et al. | |
| 2009/0319977 A1* | 12/2009 | Saxena et al. | 716/13 |
| 2010/0251234 A1 | 9/2010 | Oshins | |
| 2011/0055786 A1* | 3/2011 | Gao | 716/126 |
| 2011/0055791 A1* | 3/2011 | Gao | 716/131 |
| 2011/0320992 A1* | 12/2011 | Alpert et al. | 716/106 |
| 2012/0146099 A1* | 6/2012 | Geer et al. | 257/209 |
| 2012/0286331 A1* | 11/2012 | Aton et al. | 257/202 |

OTHER PUBLICATIONS

V. Paulo, C. Ababei, "3D Netwrok on Chip Architectures Using Homogeneous Meshes and Heterogeneous Floorplans", pp. 1-13, 2010.*

M. Khan, A. Ansari, "Quadrant Based XYZ Dimension Order Routing Algorithm for 3-D Asymmetric Torus Routing Chip (ATRC)", pp. 1-4, 2011.*

U.S. Appl. No. 12/947,445.

U.S. Appl. No. 13/189,991.

"Cray XT3TM Supercomputer Scalable by Design", Cray XT3 Datasheet, 2004-2005, 6 pages.

Hemenway, Roe et al., "An Optical Packet-Switched Interconnect for Supercomputer Applications*", Submitted as an invited paper in Journal of Optical Networking, Special Issue on Supercomputer Interconnects, Oct. 2004, 16 pages.

Hu, Jin et al., "Completing High-Quality Global Routes", Proc. Int'l. Symp. on Physical Design (ISPD), Mar. 2010, 7 pages.

Lakshin, G. L. et al., "ECL LSI Design and Test Experience in Supercomputer Development", INSPEC, Proceedings of the Third Eurochip Workshop on VLSI Design Training, 21-26, CMP/EUROCHIP, Grenoble, France, 1992, 1 page.

McMurchie, Larry et al., "PathFinder: A Negotiation-Based Performance-Driven Router for FPGAs", In Proc. ACM Symp. on FPGAs, 1995, pp. 111-117.

Moffitt, Michael D., "Automated Planning in Physical Synthesis", U.S. Appl. No. 12/855,009, filed Aug. 12, 2010, 37 pages.

Moller, Dietmar P. et al., "Simulation of an Embedded Processor Kernel Design on SRAM-Based FPGA", Proceedings of the SCS, Jul. 1999, 6 pages.

Tsai, Jeng-Liang, "Clock Tree Synthesis for Timing Convergence and Timing Yield Improvement in Nanometer Technologies", University of Wisconsin-Madison, 2005, 123 pages. (pp. 1-62).

Tsai, Jeng-Liang, "Clock Tree Synthesis for Timing Convergence and Timing Yield Improvement in Nanometer Technologies", University of Wisconsin-Madison, 2005, 123 pages. (pp. 63-123).

Viswanathan, Natarajan et al., "ITOP: Integrating Timing Optimization within Placement", ISPD'10, San Francisco, California, Mar. 14-17, 2010, pp. 83-90.

Yang, Q. et al., "WDM/TDM Optical Packet Switched Network for Supercomputing", Optics in Computing 2000, SPIE, vol. 4089, 2000, pp. 555-561.

Zhu, Yi et al., "Advancing Supercomputer Performance Through Interconnection Topology Synthesis", IEEE/ACM International conference on Computer-Aided Design (ICCAD), Nov. 10-13, 2008, San Jose, CA, USA, pp. 555-558.

Office Action mailed Feb. 15, 2012, for U.S. Appl. No. 12/947,445; 12 pages.

Response to Office Action filed with the USPTO on May 11, 2012 for U.S. Appl. No. 12/947,445, 19 pages.

Papa, David et al,, "Physical Synthesis With Clock-Network Optimization for Large Systems on Chips", IEEE Micro, pp. 51-62, Jul. 2011.

Interview Summary dated Dec. 11, 2013 for U.S. Appl. No. 13/572,144; 8 pages.

Interview Summary dated Dec. 12, 2013 for U.S. Appl. No. 13/189,991; 11 pages.

Notice of Allowance mailed Oct. 15, 2013 for U.S. Appl. No. 12/947,445; 12 pages.

Office Action mailed Sep. 23, 2013 for U.S. Appl. No. 13/189,991; 18 pages.

Office Action mailed Sep. 24, 2013 for U.S. Appl. No. 13/572,144; 18 pages.

Response to Office Action filed Dec. 10, 2013, U.S. Appl. No. 13/189,991, 18 pages.

Response to Office Action filed Dec. 10, 2013, U.S. Appl. No. 13/572,144, 12 pages.

U.S. Appl. No. 13/572,144.

Final Office Action dated Aug. 29, 2012 for U.S. Appl. No. 12/947,445; 10 pages.

Interview Summary mailed Nov. 5, 2012 for U.S. Appl. No. 12/947,445; 3 pages.

Response to Final Office Action filed with the USPTO Nov. 19, 2012 for U.S. Appl. No. 12/947,445; 12 pages.

* cited by examiner

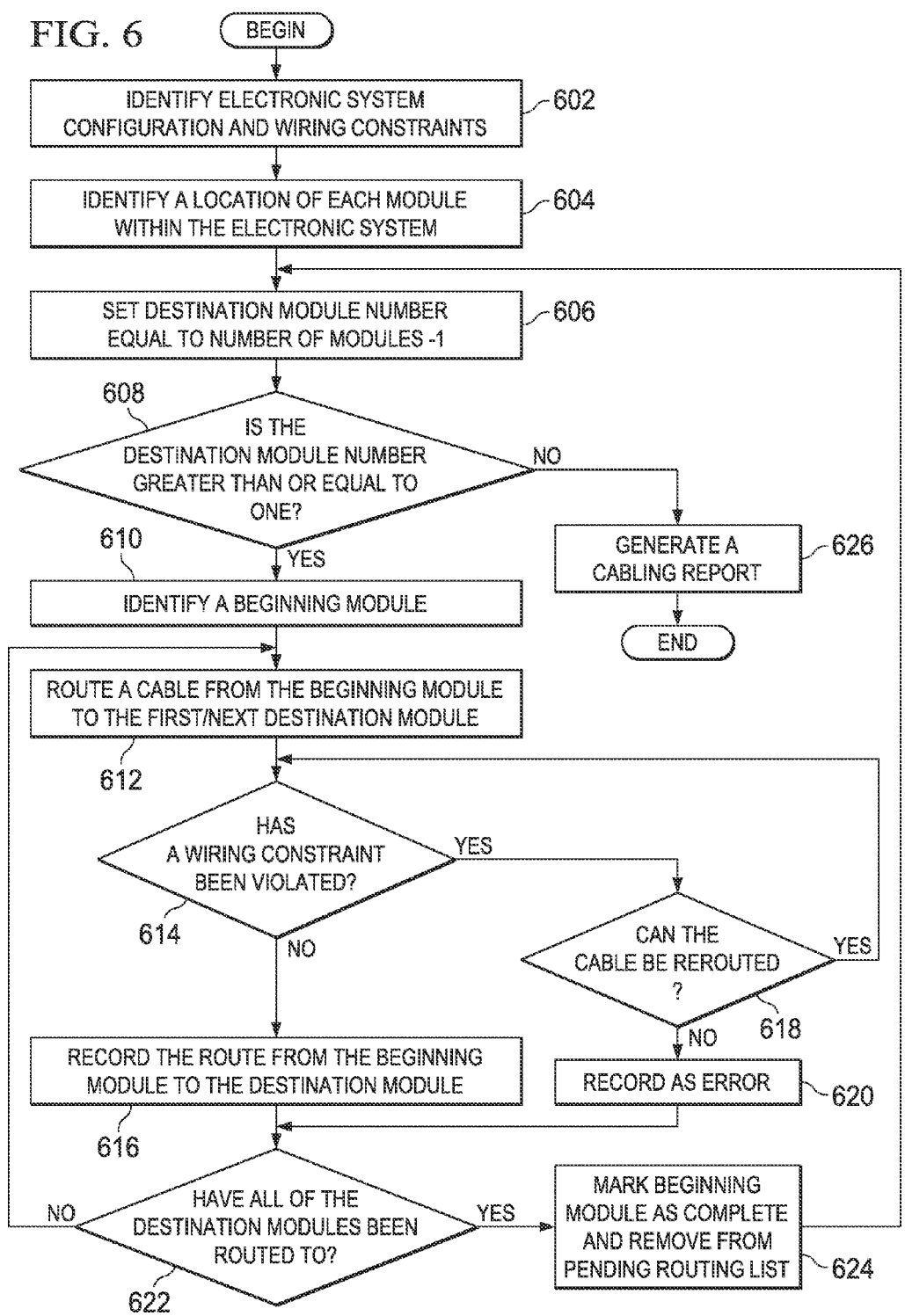

MINIMIZING THE MAXIMUM REQUIRED LINK CAPACITY FOR THREE-DIMENSIONAL INTERCONNECT ROUTING

BACKGROUND

The present application relates generally to an improved data processing apparatus and method and more specifically to mechanisms for minimizing the maximum required link capacity for three-dimensional interconnect routing.

Electronic systems often include components that are desirably accessible during operation or shutdown of the electronic system. For example, an electronic system may include a chassis holding computer boards, where the chassis or boards may be withdrawn from the remainder of the electronic system so that the computer boards are accessible. Accessibility of the computer boards may be desirable for a number of reasons such as replacement, repair, upgrade, etc.

Cables provide interconnection between components held in the chassis (e.g., the computer cards) and the remainder of the electronic system. However, many electronic systems are hindered by limited physical space for routing interconnect between boards and the chassis, and thus, wiring between devices of the electronic system is generally cluttered and unorganized making work on the electronic system such as assembly, reconfiguration and maintenance difficult and time consuming.

SUMMARY

In one illustrative embodiment, a method, in a data processing system, is provided for determining connectivity while minimizing wiring in an electronic system. The illustrative embodiment identifies a configuration of the electronic system, a location of each module in a plurality of modules within the electronic system and at least one constraint with regard to wiring the electronic system, the location of each module being identified using three-dimensional coordinates. The illustrative embodiment routes separate cables from each module in the plurality of modules to each of the other modules in the plurality of modules without violating any constraints, thereby forming a plurality of cables. The illustrative embodiment generates a cabling list indicating how each cable in the plurality of cables is to be routed in the electronic system in order to not violate any constraints and provide connectivity while minimizing wiring.

In other illustrative embodiments, a computer program product comprising a computer useable or readable medium having a computer readable program is provided. The computer readable program, when executed on a computing device, causes the computing device to perform various operations outlined above, and combinations thereof, with regard to the method illustrative embodiment.

In yet another illustrative embodiment, a system/apparatus is provided. The system/apparatus may comprise one or more processors and a memory coupled to the one or more processors. The memory may comprise instructions which, when executed by the one or more processors, cause the one or more processors to perform various operations outlined above, and combinations thereof, with regard to the method illustrative embodiment.

These and other features and advantages of the present invention will be described in, or will become apparent to those of ordinary skill in the art in view of, the following detailed description of the example embodiments of the present invention.

BRIEF DESCRIPTION OF THE SEVERAL VIEWS OF THE DRAWINGS

The invention, as well as a preferred mode of use and further objectives and advantages thereof, will best be understood by reference to the following detailed description of illustrative embodiments when read in conjunction with the accompanying drawings, wherein:

FIG. 6 provides a flowchart outlining example operations of determining connectivity while minimizing wiring in an electronic system in accordance with an illustrative embodiment.

DETAILED DESCRIPTION

The illustrative embodiments provide a mechanism for minimizing the maximum required link capacity for three-dimensional interconnect routing. The illustrative embodiments provide a methodology for interconnecting a three-dimensional computing system that minimizes dedicated wiring space and simplifies the installation of interconnect cables.

Figure 1:
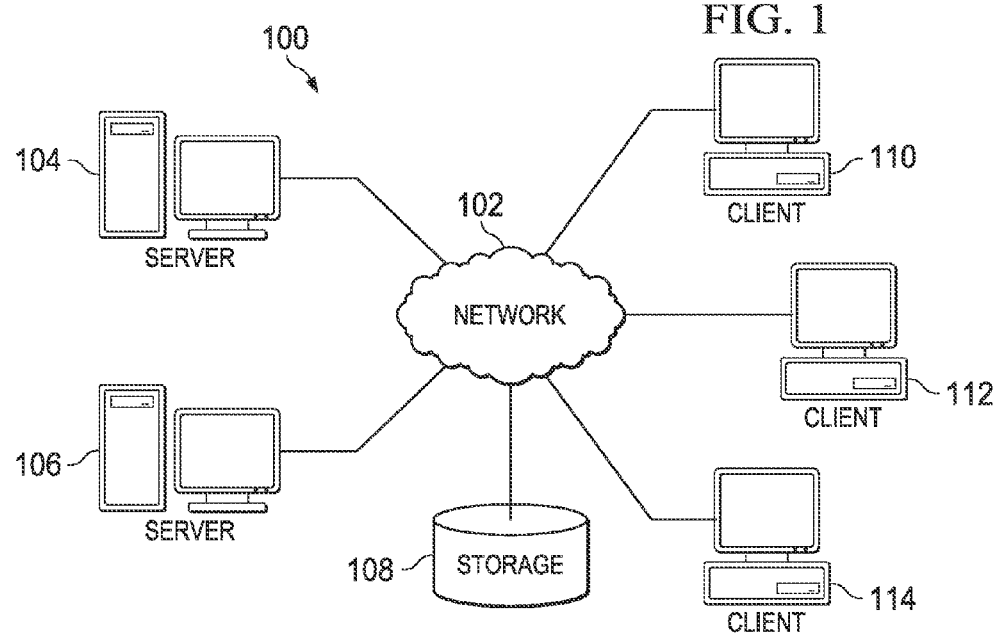
FIG. 1 depicts a pictorial representation of an example distributed data processing system in which aspects of the illustrative embodiments may be implemented.
Figure 2:
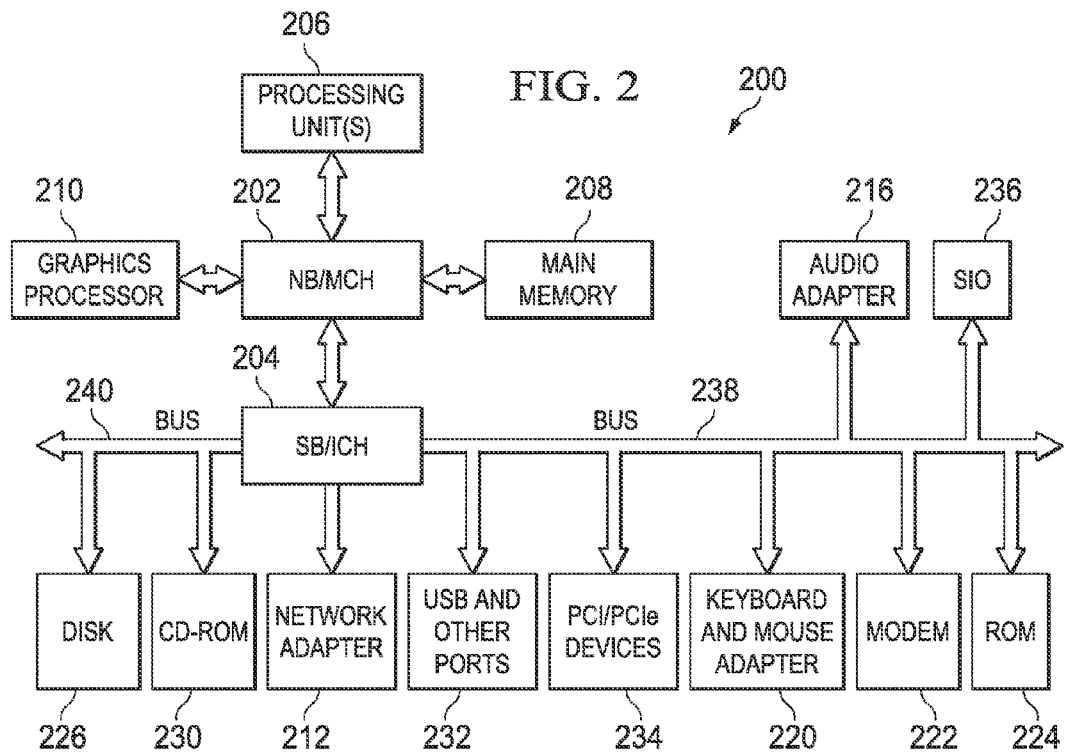
FIG. 2 shows a block diagram of an example data processing system in which aspects of the illustrative embodiments may be implemented.

Thus, the illustrative embodiments may be utilized in many different types of data processing environments including a distributed data processing environment, a single data processing device, or the like. In order to provide a context for the description of the specific elements and functionality of the illustrative embodiments, FIGS. 1-2 are provided hereafter as example environments in which aspects of the illustrative embodiments may be implemented. While the description following FIGS. 1-2 will focus primarily on a single data processing device implementation of a mechanism that minimizes the maximum required link capacity for three-dimensional interconnect routing, this is only an example and is not intended to state or imply any limitation with regard to the features of the present invention. To the contrary, the illustrative embodiments are intended to include distributed data processing environments and embodiments in which the maximum required link capacity for three-dimensional interconnect routing may be minimized without departing from the spirit and scope of the invention.

With reference now to the figures and in particular with reference to FIGS. 1-2, example diagrams of data processing environments are provided in which illustrative embodiments of the present invention may be implemented. It should be appreciated that FIGS. 1-2 are only examples and are not intended to assert or imply any limitation with regard to the environments in which aspects or embodiments of the present invention may be implemented. Many modifications to the depicted environments may be made without departing from the spirit and scope of the present invention.

With reference now to the figures, FIG. 1 depicts a pictorial representation of an example distributed data processing system in which aspects of the illustrative embodiments may be implemented. Distributed data processing system 100 may include a network of computers in which aspects of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an example data processing system is shown in which aspects of the illustrative embodiments may be implemented. Data processing system 200 is an example of a computer, such as client 110 in FIG. 1, in which computer usable code or instructions implementing the processes for illustrative embodiments of the present invention may be located, In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, white PCIe does not. ROM 224 may be, for example, a flash basic input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® 7 (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Oracle and/or its affiliates in the United States, other countries, or both).

As a server, data processing system 200 may be, for example, an IBM® eServer™ System p® computer system, running the Advanced Interactive Executive (AIX®) operating system or the LINUX® operating system (eServer, System p, and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

Figure 3:
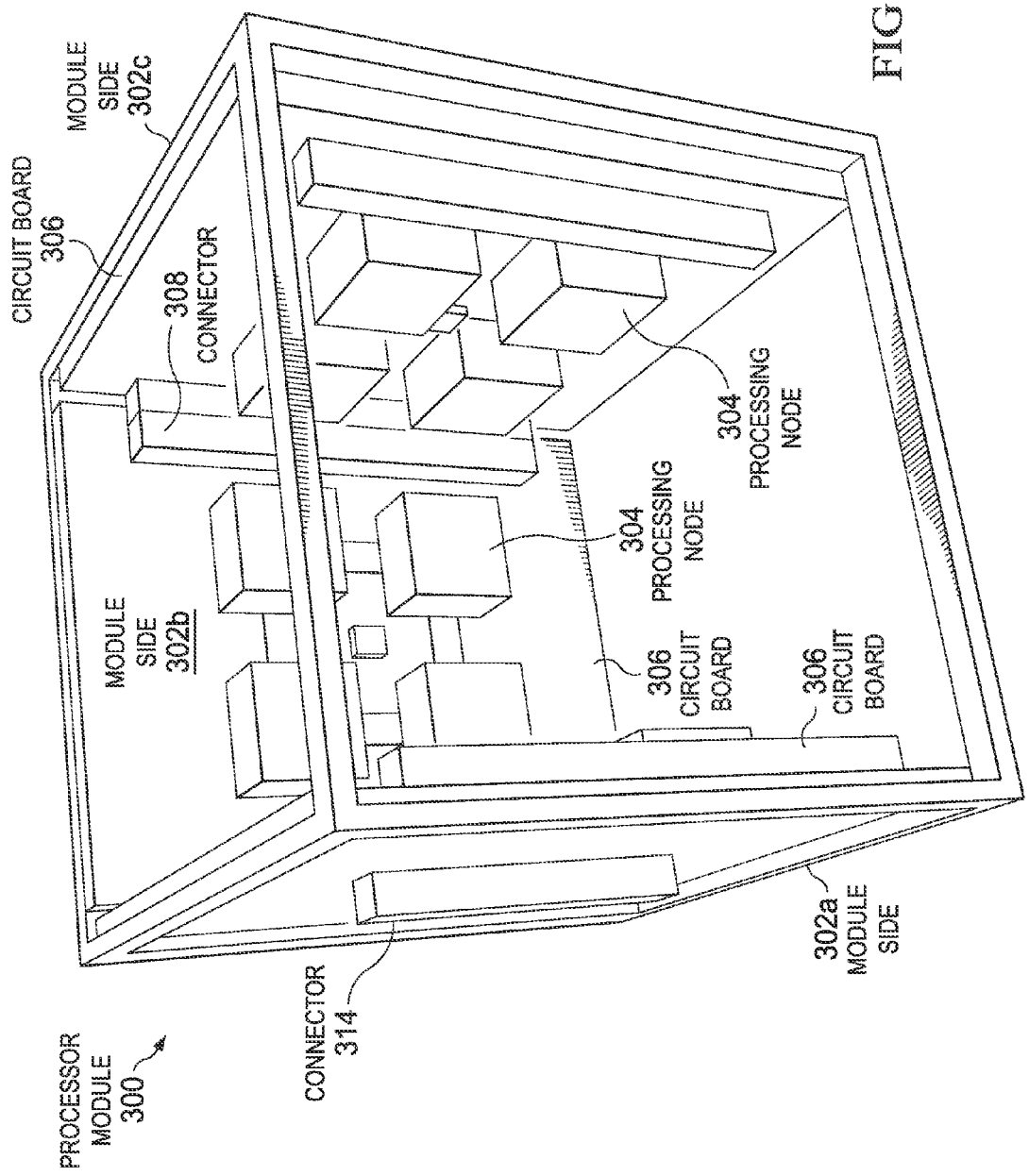
FIG. 3 depicts an exemplary cubical processing module in accordance with an illustrative embodiment.

Again, the illustrative embodiments provide a mechanism for minimizing the maximum required link capacity for three-dimensional interconnect routing. The following description is depicted through the use of an electronic system that provides a compact arrangement of modules configured in frame. While the following embodiments are described with relation to a module of cubical design, the illustrative embodiments are not limited to only a cubical design. That is, other three-dimensional geometric configurations may also be used, such as a rectangular box, without departing from the spirit and scope of the present invention, FIG. 3 depicts an exemplary cubical processing module 300 in accordance with an illustrative embodiment. In FIG. 3 partially constructed processing module 300 shows three processing module sides 302a, 302b, and 302c coupled together. As shown in FIG. 3, processing module side 302b is coupled to processing module side 302c via connectors, such as connectors 308. Furthermore, processing module side 302a is shown to have exterior connector 314 for interfacing with a backplane or point of connection of an electronic system, which will be described in detail below. While only one of exterior connector 314 is shown, depending on implementation, more than one of external connector 314 may be required for interfacing to the electronic system. Each of processing module sides 302a, 302b, and 302c comprise one or more of processing nodes 304 coupled to its respective circuit board 306. Each of processing nodes 304 may comprise memory, processing layers, and connectivity to other ones of processing nodes 304 either coupled directly to circuit board 306 or coupled via connectors 308 to processing nodes on other circuit boards 306. Processing nodes 304 may be coupled directly to circuit board 306 in a manner in which if one of processing nodes 304 fail, the processing node may removed and replaced with a functional processing node. Similarly, circuit board 306 may also be coupled to processing module side 302 in a manner in which if circuit board 306 fails, the entire circuit board 306 may removed and replaced with a functional circuit board 306. Each of connectors 308 may be any type of connector that provides connectivity to power, other circuit boards, storage, input/output (I/O), or the like. The connectivity provided by connectors 308 may be wire, fiber optic, or the like. While FIG. 3 only depicts a processing module, any type of module may be used in an electronic system without departing from the spirit and scope of the invention. The other types of modules may include a storage module, an input/output (I/O) module, a filler module, or the like.

Figure 4A:
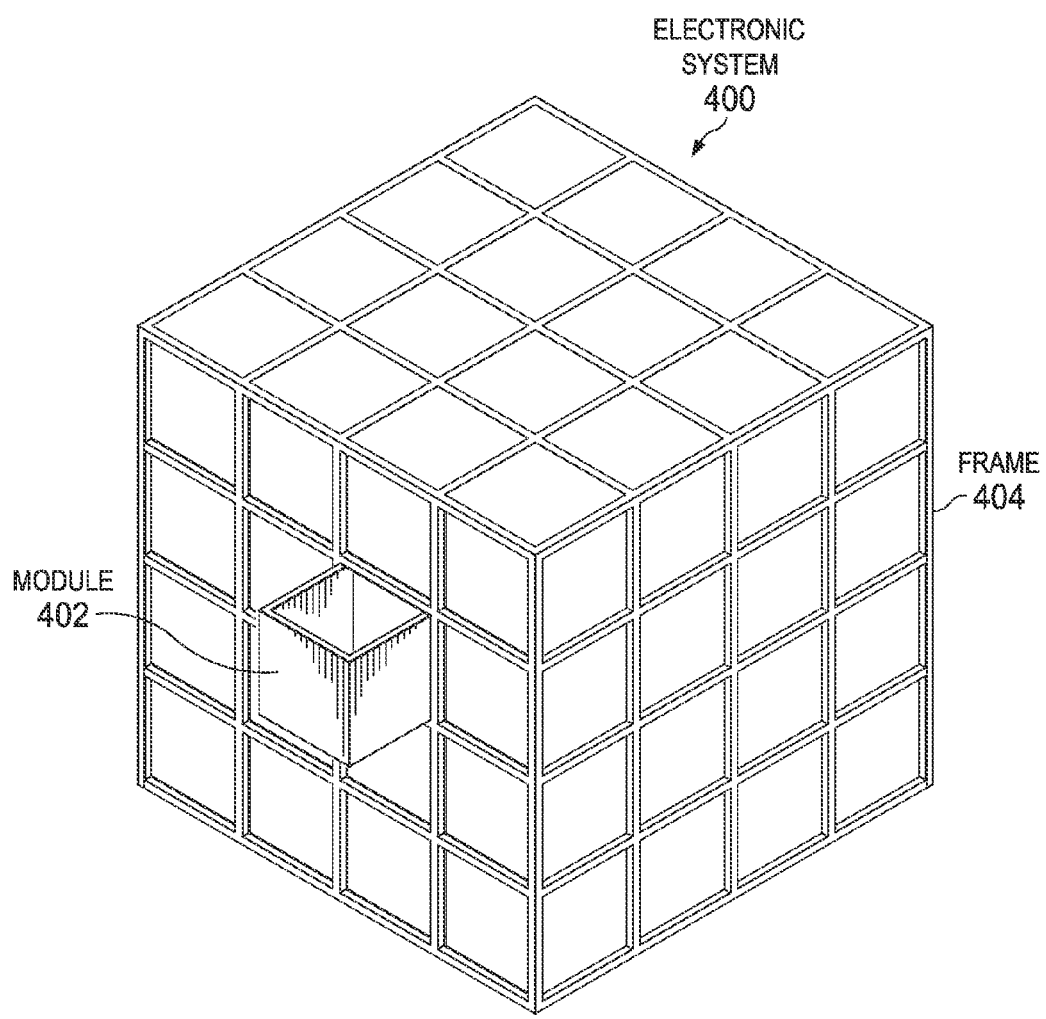
FIG. 4A depicts one example of a scalable space-optimized and energy-efficient electronic system in accordance with an illustrative embodiment.

FIG. 4A depicts one example of a scalable space-optimized and energy-efficient electronic system in accordance with an illustrative embodiment. In FIG. 4A, an electronic system 400 provides a compact arrangement of modules 402 configured in frame 404 that reduces communication cost, reduces cooling cost, provides reliable operation, and facilitates maintainability. The modular design of electronic system 400 provides these benefits by assembling the modules in a hexadron (non-regular cube) according to the computing needs of the end-user which reduces distance for the communication links. Each of modules 402 may be either a processing module, a storage module, an input/output (I/O) module, or a filler module and may be installed in frame 404 similar to a drawer as is illustrated. The other components of electronic system 400 will now be described in detail.

Figure 4B:
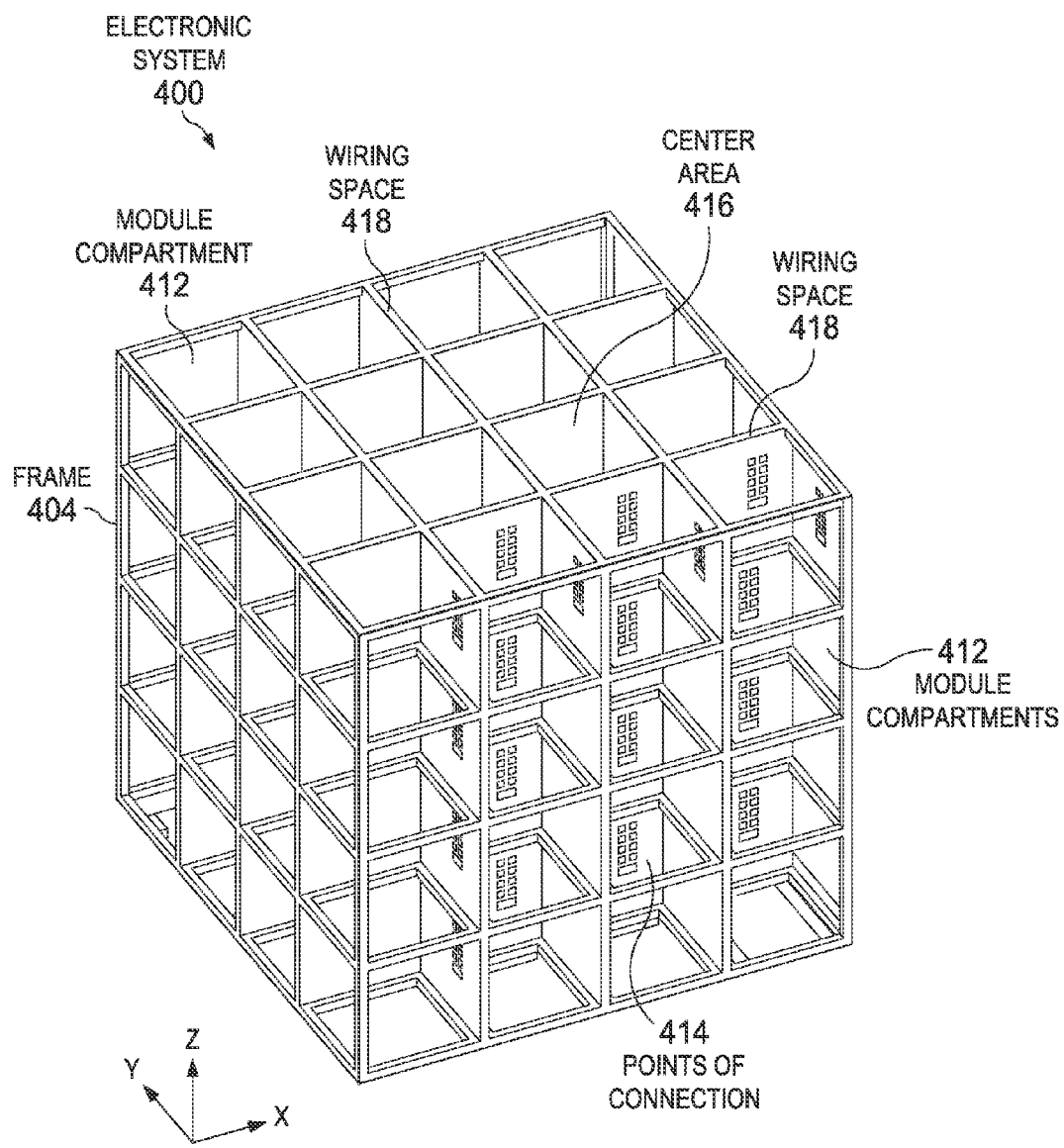
FIG. 4B depicts an exemplary frame of an electronic system in accordance with an illustrative embodiment.

FIG. 4B depicts an exemplary frame of an electronic system in accordance with an illustrative embodiment. Frame 404 provides a plurality of identical module compartments 412 such that any type of module may be inserted into a single one of module compartment 412 and be connected via point of connection 414 to power, storage, communication, or whatever access is required by the module. Frame 404 provides sections between each of module compartments 412 so that cabling may be run between the various connectors of the points of connection as well as to external power and network connects for environments where electronic system 400 is deployed. Additionally, the top and bottom of each of module compartments 412 are open so that air may flow through each column of module compartments 412 from an air inlet to an air mixing plenum. Each level of module compartments may also be individual sections such that electronic system 400 may comprise as few as one level up to any number of levels such that the power and cooling needs are still met by electronic system 400. Also shown in FIG. 4B is center area 416 which may be left empty or may be used for other modules. Thus, the unique design of electronic system 400 limits power and communication interconnection to wiring spaces 418 between module compartments 412. While FIGS. 4A and 4B depict a electronic system shown in a 4 by 4 configuration with only the exterior module compartments populated, the description that follows may be used with any type of electronic system or network topology, such as a 3 by 3, a 3 by 2, a 2 by 2, or the like, with or without the center compartments being populated.

Figure 5:
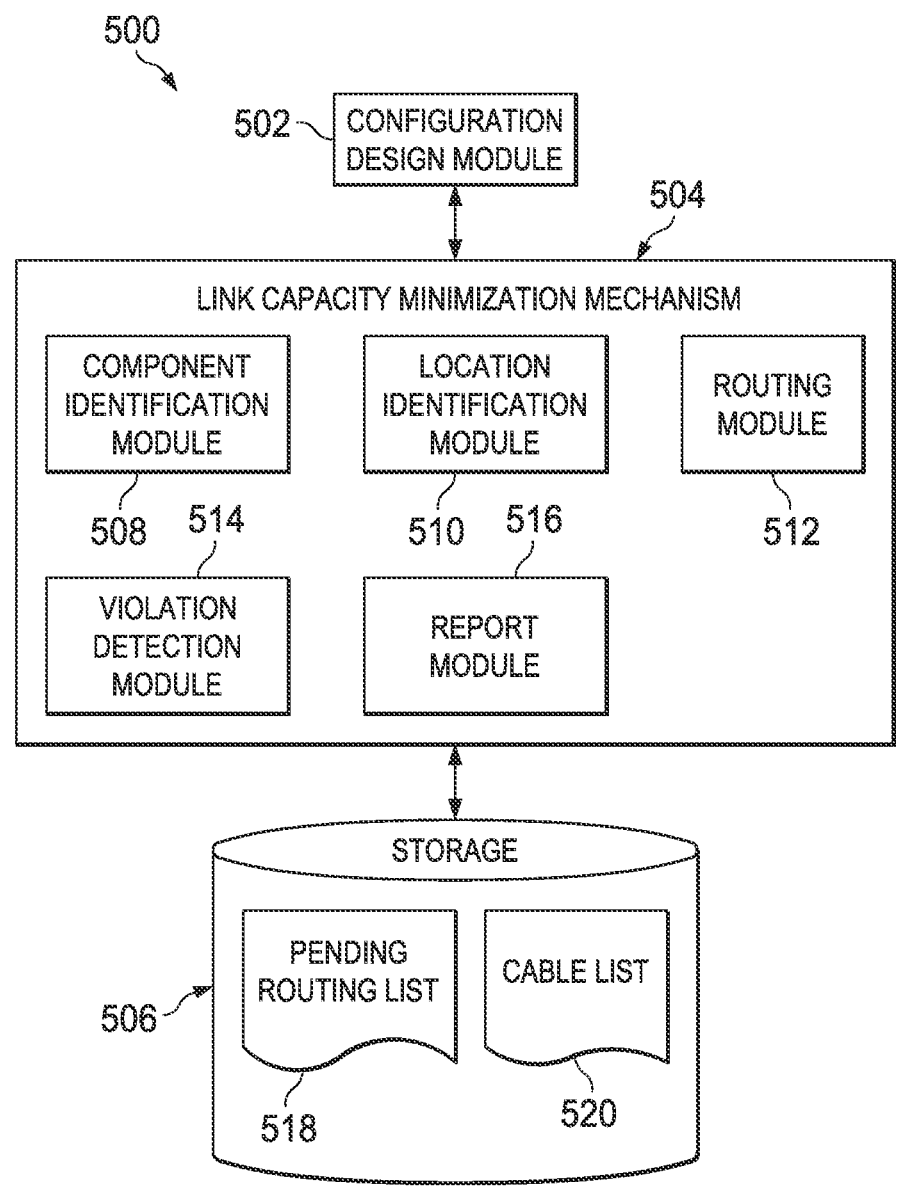
FIG. 5 depicts a block diagram of a mechanism that determines connectivity while minimizing wiring in an electronic system in accordance with an illustrative embodiment.

In order to minimize the maximum required link capacity for interconnect routing of an electronic system, the illustrative embodiments target the modularity of the electronic system a standard socket design, that requires a minimum number of pins capable to achieve connectivity goal between points of connection for connectivity while minimizing the wiring in the wiring spaces behind any one of points of connection. FIG. 5 depicts a block diagram of a mechanism that determines connectivity while minimizing wiring in an electronic system in accordance with an illustrative embodiment. Data processing system 500 comprises configuration design module 502, link capacity minimization mechanism 504, and storage 506. Link capacity minimization mechanism 504 further comprises component identification module 508, location identification module 510, routing module 512, violation detection module 514, and report module 516. Configuration design module 502 provides an interface to a user so that the user may design an electronic system, such as the 4 by 4 electronic system of FIGS. 4A and 4B. Once a design for an electronic system has been completed and submitted to link capacity minimization mechanism 504, component identification module 508 identifies the exact configuration of the electronic system and any constraints that are identified with regard to the wiring of the electronic system, such as a limit to the number of wires that may pass through the wiring space behind one or more identified modules, a set of modules, or for all modules, a maximum length of cable between two modules, or the like. Component identification module 508 adds the modules and constraints to pending routing list 518 in storage 506.

With the components and constraints identified, location identification module 510 identifies a location of each module within the electronic system. Also, since the electronic system is three-dimensional, location identification module 510 identifies the location in X, Y, and Z coordinates based on the point of connection of the module compartment where each module will be inserted. Location identification module 510 adds the location of each of the modules to pending routing list 518. Routing module 512 then uses pending routing list 518 to route cables between the various points of connection in the electronic system. In order to route the various required cables, routing module 512 sets a destination module number equal to the number of modules in pending routing list minus 1. Routing module 512 then determines whether the destination module number is greater than or equal to 1. If the destination module number is greater than or equal to 1, routing module 512 identifies a beginning module and routes a cable from the beginning module point of connection to a first destination module point of connection. With the first cable routed, violation detection module 514 determines whether a constraint has been violated. If no constraint has been violated, routing module 512 records an exact route that the cable is to be run from the beginning module point of connection to the destination module point of connection in cabling list 520. Cabling list 520 identifies a cable for each module-module pair along with the length of the cable based on the routing.

Routing module 512 then determines if there is another destination module to be routed to/from the beginning module. If so, routing module 512 routes a cable from the beginning module point of connection to a next destination module point of connection. With the next cable routed, violation detection module 514 determines whether a constraint has been violated. If no constraint has been violated, routing module 512 records an exact route that the cable is to be run from the beginning module point of connection to the next destination module point of connection in cabling list 520. The process repeats until all cables have been routed from the beginning module point of connection to all destination module points of connection.

Once all of the cables have been routed from the beginning module point of connection to all destination module points of connection, routing module 512 marks the beginning module as complete and removes the beginning module from pending routing list 518. Routing module 512 sets the destination module number equal to the remaining number of modules in pending routing list minus 1. Routing module 512 then determines whether the destination module number is greater than or equal to 1. If the destination module number is greater than or equal to 1, routing module 512 identifies a new beginning module and repeats the process above until all cables have been routed from the new beginning module point of connection to all destination module points of connection. Routing module 512 marks the new beginning module as complete, removes the beginning module from pending routing list 518, and the process repeats until all cables have been routed.

If during the routing of a cable from a beginning module point of connection to a destination module point of connection violation detection module 514 detects a violation of a constraint has occurred, then routing module 512 attempts to reroute the cable a different way such that there is no violation of any constraint. Routing module 512 may attempt the rerouting a predetermined number of times or until all attempts at rerouting have failed. Routing module 512 may also place the current cable routing in abeyance and attempt to reroute a previously routed cable in order for the current cable to be routed. If all of the attempts at rerouting have failed or if the predetermined number of times at rerouting has been reached, routing module 512 may record the route that the cable from the beginning module point of connection to the destination module point of connection as "Not Possible with Current Constraints" or something similar.

Once routing module 512 has routed or attempted to reroute all cable between all of the modules, report module 516 may generate a report that lists how each cable in cabling list 520 is to be routed in the electronic system as well as a length associated with each cable. Report module 516 may generate the report such that a user has explicit instruction how each cable should be run within the frame of the electronic system with regard to X, Y, and Z directions. Report module 516 may also include information pertaining to a number of cables passing between any two or more modules as well as determining a worst case latency for each cable. Thus, the report identifies connectivity while minimizing the wiring in the wiring spaces behind any one of the module points of connection.

Additionally, the above process may be rerun multiple times with different constraints. Based on the results of each run, link capacity minimization mechanism 504 may identify a best solution based on one or more criteria. The criteria may include total cable length, worst case latency, number of cables passing between any two or more nodes, or the like.

As will be appreciated by one skilled in the art, the present invention may be embodied as a system, method, or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency (RF), etc., or any suitable combination thereof.

Computer program code for carrying out operations for aspects of the present invention may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to the illustrative embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart, and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions that implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing the functions/acts specified in the flowchart and/or block diagram block or blocks.

Referring now to FIG. 6, this figure provides a flowchart outlining example operations of determining connectivity while minimizing wiring in an electronic system in accordance with an illustrative embodiment. Based on a request to provide optimized cabling for an electronic system, the operating begins by a component identification module identifying the exact configuration of the electronic system and any constraints that are identified with regard to the wiring of the electronic system, which are added to a pending routing list (step 602). With the components and constraints identified, a location identification module identifies a location of each module within the electronic system in X, Y, and Z coordinates based on the point that the cable will be connected to the electronic system, which is also added to the pending routing list (step 604).

Using the pending routing list, the routing module sets a destination module number equal to the number of modules in pending routing list minus 1 (step 606). The routing module then determines whether the destination module number is greater than or equal to 1 (step 608). If at step 608 the destination module number is greater than or equal to 1, the routing module identifies a beginning module (step 610) and routes a cable from the beginning module point of connection to a first/next destination module point of connection (step 612). With the first cable routed, a violation detection module determines whether a constraint has been violated (step 614). If at step 614 no constraint has been violated, the routing module records an exact route that the cable is to be run from the beginning module point of connection to the destination module point of connection in a cabling list (step 616).

If at step 614 a constraint has been violated, the routing module attempts to reroute the cable a different way such that there is no violation of any constraint (step 618). The routing module may attempt the rerouting a predetermined number of times or until all attempts at rerouting have failed. The routing module may also place the current cable routing in abeyance and attempt to reroute a previously routed cable in order for the current cable to be routed. If at step 618 the cable can be rerouted, then the operation returns to step 614. If at step 618 all of the attempts at rerouting have failed or if the predetermined number of times at rerouting has been reached, the routing module may record the route as an error and that the cable from the beginning module point of connection to the destination module point of connection as "Not Possible with Current Constraints" or something similar (step 620).

From step 616 or step 620, the routing module then determines if there is another destination module to be routed to/from the beginning module (step 622). If at step 622 there is another destination module to be routed to/from the beginning module, the operation returns to step 612. If at step 622 all of the cables have been routed from the beginning module point of connection to all destination module points of connection, the routing module marks the beginning module as complete and removes the beginning module from the pending routing list (step 624). The operation then returns to step 606, where the routing module sets the destination module number equal to the remaining number of modules in pending routing list minus 1. The routing module then determines whether the destination module number is greater than or equal to 1 (step 608). If at step 608 the destination module number is greater than or equal to 1, then the operation continues to step 610 as described above.

If at step 608 the destination module number is not greater than or equal to 1, then a report module generates a report that lists how each cable in the cabling list 620 is to be routed in the electronic system as well as a length associated with each cable (step 626), with the operation ending thereafter. The report module generates the report such that a user has explicit instruction how each cable should be run within the frame of the electronic system with regard to X, Y, and Z directions. Thus, the report identifies connectivity while minimizing the wiring in the wiring spaces behind any one of the module points of connection.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based, systems that perform the specified functions or acts, or combinations of special purpose hardware and computer instructions.

Thus, the illustrative embodiments provide mechanisms for minimizing the maximum required link capacity for three-dimensional interconnect routing. The illustrative embodiments provide a methodology for interconnecting a three-dimensional computing system that minimizes dedicated wiring space and simplifies the installation of interconnect cables.

As noted above, it should be appreciated that the illustrative embodiments may take the form of an entirety hardware embodiment, an entirely software embodiment or an embodiment containing both hardware and software elements. In one example embodiment, the mechanisms of the illustrative embodiments are implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, hulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for determining connectivity while minimizing wiring in an electronic system, the method comprising:
   identifying, by a link capacity minimization mechanism in the data processing system, a configuration of the electronic system, a location of each module in a plurality of modules within the electronic system and any constraints with regard to wiring the electronic system, wherein the location of each module is identified using three-dimensional coordinates;
   routing, by the link capacity minimization mechanism, separate cables from each module in the plurality of modules to each of the other modules in the plurality of modules without violating any constraints, thereby forming a plurality of cables, wherein routing the separate cable from each module in the plurality of modules to each of the other modules in the plurality of modules without violating any constraints further comprises:
      generating, by the link capacity minimization mechanism, pending routing list comprising all of the plurality of modules in the electronic system;
      setting, by the link capacity minimization mechanism, a destination module number equal to a number of modules in the plurality of modules minus 1;
      determining, by the link capacity minimization mechanism, whether the destination module number is greater than or equal to 1;
      responsive to the destination module number being greater then or equal to 1, identifying, by the link capacity minimization mechanism, a beginning module in the of modules;
      routing, by the link capacity minimization mechanism, a cable from a point of connection of the beginning module to a point of connection of a destination module in the plurality of modules, wherein the destination module is one of the other modules in the plurality of modules;
      determining, by the link capacity minimization mechanism, whether any constraints have been violated;
      responsive to not violating any constraints, recording, by the link capacity minimization mechanism an exact route that the cable is to be run from the point of connection of the beginning module to the point of connection of the destination module in a cabling list;
      determining, by the link capacity minimization mechanism, whether there is another destination module in the plurality of modules to be routed to/from the beginning module; and
      responsive to the existence of another destination module, repeating, by the link capacity minimization mechanism, the routing, determining, recording, and determining steps, until the cable has been routed from the beginning module to each of the other modules in the plurality of modules; and
   generating, by the link capacity minimization mechanism the cabling list indicating how each in the plurality of cables is to be routed in the electronic system in order to not violate any constraints and provide connectivity while minimizing wiring.

2. The method of claim 1, wherein routing the separate cables from each module in the plurality of modules to each of the other modules in the plurality of modules without violating any constraints further comprises:
   responsive to violating any constraints, attempting, by the link capacity minimization mechanism, to reroute the cable a different way such that there is no violation of any constraint; and
   responsive to a successful reroute of the cable, recording, by the link capacity minimization mechanism, the exact route that the cable is to be run from the point of connection of the beginning module to the point of connection of the destination module in the cabling list.

3. The method of claim 2, further comprising:
   responsive to an unsuccessful attempt to reroute of the cable, determining, by the link capacity minimization mechanism, whether a previously routed cable can be rerouted in order for the cable to be routed without violation;

responsive to identifying the previously routed cable that can be rerouted in order for the cable to be routed without violation, modifying, by the link capacity minimization mechanism, the exact route of the previously routed cable; and recording, by the link capacity minimization mechanism, the exact route that the previously routed cable is to be run from the point of connection of the beginning module to the point of connection of the destination module in the cabling list.

4. The method of claim 3, further comprising;

responsive to a failure to identify the previously routed cable that can be rerouted in order for the cable to be routed without violation, recording, by the link capacity minimization mechanism, an error indicating that the cable cannot be run without violation.

5. The method of claim 1, wherein routing the separate cables from each module in the plurality of modules to each of the other, modules in the plurality of modules without violating constraints further comprises:

responsive to the absence of another destination module, marking, by the link capacity minimization mechanism, the beginning module as complete in the cabling list;

removing, by the link capacity minimization mechanism, the beginning module from the pending routing list;

decreasing, by the link capacity minimization mechanism, the destination module number by 1;

determining, by the link capacity minimization mechanism, whether the destination module number is greater than or equal to 1;

responsive to the destination module number being greater than or equal to 1, repeating the identifying, routing, determining, recording, determining, and repeating steps, by the link capacity minimization mechanism, until all cables have been routed from each module in the plurality of modules to each of the other modules in the plurality of modules in the pending routing list.

6. The method of claim 1, further comprising:

rerunning, by the link capacity minimization mechanism, the steps of identifying, routing, and generating using at least one new constraint;

comparing, by the link capacity minimization mechanism, the cabling list using any constraints to a new cabling list using the at least one new constraint; and identifying, by the link capacity minimization mechanism, a best solution between the cabling list and the new cabling list based on one or more criteria, wherein the one or more criteria comprises a total cable length, a worst case latency, or a number of cables passing between any two or more nodes.

7. The method of claim 1, wherein the cabling list includes at least one explicit instruction of how each cable should be run within the frame of the electronic system with regard to three-dimensional directions, a length of each cable, or a priority with which each cable should be installed.

8. A computer program product comprising a non-transitory computer readable storage medium having a computer readable program stored therein, wherein the computer readable program, when executed on a computing device, causes the computing device to:

identify a configuration of the electronic system, a location of each module in a plurality of modules within the electronic system and any constraints with regard to wiring the electronic system, wherein the location of each module is identified using three-dimensional coordinates;

route separate cables from each module in the plurality of modules to each of other modules in the plurality of modules without violating any constraints, thereby forming a plurality of cables, wherein the computer readable program to route the separate cable from each module in the plurality of modules to each of the other modules in the plural modules without violating any constraints further causes the computer device to:

generate pending routing list comprising all of the plurality of modules in the electronic system;

set a destination module number equal to a number of modules in the plurality of modules minus 1;

determine whether the destination module number is greater than or equal to 1;

responsive to the destination module number being than or equal to 1, identify a beginning module in the plurality of modules;

route a cable from a point of connection of beginning module to a point of connection of a destination module in the plurality of modules, wherein the destination module is one of the other modules in the plurality of modules;

determine whether any constraints have been violated;

responsive to not violating any constraints, record an exact route that the cable is to be run from the point of connection of the beginning module to the point of connection of the destination module in a cabling list;

determine whether there is another destination module in the plurality of modules to be routed to/from the beginning module; and responsive to the existence of another destination module, repeat the routing, determining, recording, and determining, until the cable has been routed from the beginning module to each of the other modules in the plurality of modules; and generate the cabling list indicating how each cable in the plurality of cables is to be routed in the electronic system in order to not violate any constraints and provide connectivity while minimizing wiring.

9. The computer program product of claim 8, wherein the computer readable medium to route the separate cables from each module in the plurality of modules to each of the other modules in the plurality of modules without violating any constraints further causes the computing device to:

responsive to violating any constraints, attempt to reroute the cable a different way such that there is no violation of any constraint; and responsive to a successful reroute of the cable, record the exact route that the cable is to be run from the point of connection of the beginning module to the point of connection of the destination module in the cabling list.

10. The computer program product of claim 9, wherein the computer readable medium further causes the computing device to:

responsive to an unsuccessful attempt to reroute of the cable, determine whether a previously routed cable can be rerouted in order for the cable to be routed without violation;

responsive to identifying the previously routed cable that can be rerouted in order for the cable to be routed without violation, modify the exact route of the previously routed cable; and record the exact route that the previously muted cable is to be run from the point of connection of the beginning module to the point of connection of the destination module in the cabling list.

11. The computer program product of claim 10, wherein the computer readable medium further causes the computing device to:

responsive to a failure to identify the previously routed cable that can be rerouted in order for the cable to be routed without violation, record an error indicating that the cable cannot be run without violation.

12. The computer program product of claim 8, wherein the computer readable medium to route the separate cables from each module in the plurality of modules to each of the other modules in the plurality of modules without violating any constraints further causes the computing device to:

responsive to the absence of another destination module, mark the beginning module as complete in the cabling list;
remove the beginning module from the pending routing list;
decrease the destination module number by 1;
determine whether the destination module number is greater than or equal to 1; and
responsive to the destination module number being greater than or equal to 1, repeat the identifying, routing, determining, recording, determining, and repeating until all cables have been routed from each module in the plurality of modules to each of the other modules in the plurality of modules in the pending routing list.

13. The computer program product of claim 8, wherein e computer readable medium further causes the computing device to:

rerun the identifying, routing, and generating using at least one new constraint;
compare the cabling list using any constraints to a new cabling list using the at least one new constraint; and
identify a best solution between the cabling list and the new cabling list based on one or more criteria, wherein the one or more criteria comprises a total cable length, a worst case latency, or a number of cables passing between any two or more nodes.

14. An apparatus, comprising:
a processor; and
a memory coupled to the processor, wherein the memory comprises instructions which, when executed by the processor, cause the processor to:
identify a configuration of the electronic system, a location of each module in a plurality of modules within the electronic system and any constraints with regard to wiring the electronic system, wherein the location of each module is identified using three-dimensional coordinates;
route separate cables from each module in the plurality of modules to each of the other modules in the plurality of modules without violating any constraints, thereby forming a plurality of cables, wherein the instructions to route the separate cables from each module in the plurality of modules to each of the other modules in the plurality modules without violating any constraints further cause the processor to:
generate a pending routing list comprising all of the plurality of modules in the electronic system;
set a destination module number equal o a number of modules in the plurality of modules minus 1;
determine whether the destination module number is greater than or equal to 1;
responsive to the destination module number being greater than or equal to 1, identify a beginning module in the plurality of modules;
route a cable from a point of connection of the beginning module to a point of connection of a destination module in the plurality of modules, wherein the destination module is one of the other modules in the plurality of modules;
determine whether any constraints have been violated;
responsive to not violating any constraints, record an exact route that the cable is to be run from the point of connection of the beginning module to the point of connection of the destination module in a cabling list;
determine whether there is another destination module in the plurality of modules to be routed to/from the beginning module; and
responsive to the existence of another destination module, repeat the routing, determining, recording, and determining, until the cable has been routed from the beginning module to each of the other modules in the plurality of modules; and
generate the cabling list indicating how each cable in the plurality of cables is to be routed in the electronic system in order to not violate any constraints and provide connectivity while minimizing wiring.

15. The apparatus of claim 14, wherein the instructions to route the separate cables from each module in the plurality of modules to each of the other modules in the plurality of modules without violating any constraints further cause the processor to:

responsive to violating any constraints, attempt to reroute the cable a different way such that there is no violation of any constraint; and
responsive to a successful reroute of the cable, record the exact route that the cable is to be run from the point of connection of the beginning module to the point of connection of the destination module in the cabling list.

16. The apparatus of claim 15, wherein the instructions further cause the processor to:

responsive to an unsuccessful attempt to reroute of the cable, determine whether a previously routed cable can be rerouted in order for the cable to be routed without violation;
responsive to identifying the previously routed cable that can be rerouted in order for the cable to be routed without violation, modify the exact route of the previously routed cable; and
record the exact route that the previously routed cable is to be run from the point of connection of the beginning module to the point of connection of the destination module in the cabling list.

17. The apparatus of claim 16, wherein the instructions further cause the processor to:

responsive to a failure to identify the previously routed cable that can be rerouted in order for the cable to be routed without violation, record an error indicating that the cable cannot be run without violation.

18. The apparatus of claim 14, wherein the instructions to route the separate cables from each module in the plurality of modules to each of the other modules in the plurality of modules without violating any constraints further cause the processor to:

responsive to the absence of another destination module, mark the beginning module as complete in the cabling list;
remove the beginning module from the pending routing list;
decrease the destination module number by 1;
determine whether the destination module number is greater than or equal to 1; and responsive to the destination module number being greater than or equal to 1, repeat the identifying, routing, determining, recording, determining, and repeating until all cables have been routed from each module in the plurality of modules to each of the other modules in the plurality of modules in the pending routing list.

19. The apparatus of claim 14, wherein the instructions further cause the processor to:
rerun the identifying, routing, and generating using at least one new constraint;
compare the cabling list using any constraints to a new cabling list using the at least one new constraint; and
identify a best solution between the cabling list and the new cabling list based on one or more criteria, wherein the one or more criteria comprises a total cable length, a worst case latency, or a number of cables passing between any two or more nodes.

* * * * *